(12) United States Patent
Spesser et al.

(10) Patent No.: US 11,366,176 B2
(45) Date of Patent: Jun. 21, 2022

(54) COMPENSATION DEVICE FOR LEAKAGE CURRENTS

(71) Applicant: Dr. Ing. h.c. F. Porsche Aktiengesellschaft, Stuttgart (DE)

(72) Inventors: Daniel Spesser, Illingen (DE); Tim Pfizenmaier, Leonberg (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 139 days.

(21) Appl. No.: 17/038,156

(22) Filed: Sep. 30, 2020

(65) Prior Publication Data
US 2021/0099005 A1  Apr. 1, 2021

(30) Foreign Application Priority Data

Oct. 1, 2019  (DE) .................... 10 2019 126 438.3

(51) Int. Cl.
| | |
|---|---|
| *G01R 31/52* | (2020.01) |
| *H02J 7/00* | (2006.01) |
| *H02J 7/04* | (2006.01) |
| *B60L 50/60* | (2019.01) |
| *B60L 53/10* | (2019.01) |
| *B60L 53/62* | (2019.01) |
| *G01R 31/00* | (2006.01) |
| *B60L 53/20* | (2019.01) |

(52) U.S. Cl.
CPC ............. *G01R 31/52* (2020.01); *B60L 50/60* (2019.02); *B60L 53/10* (2019.02); *B60L 53/62* (2019.02); *G01R 31/005* (2013.01); *H02J 7/0047* (2013.01); *H02J 7/00714* (2020.01); *H02J 7/04* (2013.01); *B60L 53/20* (2019.02); *H02J 2207/20* (2020.01)

(58) Field of Classification Search
CPC ..................................................... G01R 31/52
USPC ....................................................... 320/161
See application file for complete search history.

(56) References Cited

U.S. PATENT DOCUMENTS

| 9,350,162 B2 * | 5/2016 | Bettenwort ............. H02H 3/16 |
| 2011/0057707 A1 * | 3/2011 | Bronczyk .............. G01R 31/14 |
| | | 327/332 |

(Continued)

FOREIGN PATENT DOCUMENTS

| DE | 19525417 C2 | 3/2000 |
| DE | 102008024348 A1 | 12/2009 |

(Continued)

*Primary Examiner* — Jerry D Robbins
(74) *Attorney, Agent, or Firm* — RatnerPrestia

(57) ABSTRACT

A compensation device for compensating leakage currents has a differential current measurement device, a first signal generation device, an amplifier and a feeder device. The first signal generation device is designed to generate a first compensation current specification signal (I_COMP_S1) suitable for the compensation from the first signal (I_DIFF) from the differential current measurement device by way of analog signal processing and to feed this first compensation current specification signal (I_COMP_S1) to the amplifier in analog or digitized form. The amplifier is designed to generate a compensation current (I_COMP) on the basis of the first compensation current specification signal (I_COMP_S1), and the feeder device is designed to allow the compensation current to be fed in at at least one of the active conductors.

18 Claims, 6 Drawing Sheets

(56) References Cited

U.S. PATENT DOCUMENTS

Figure 1:
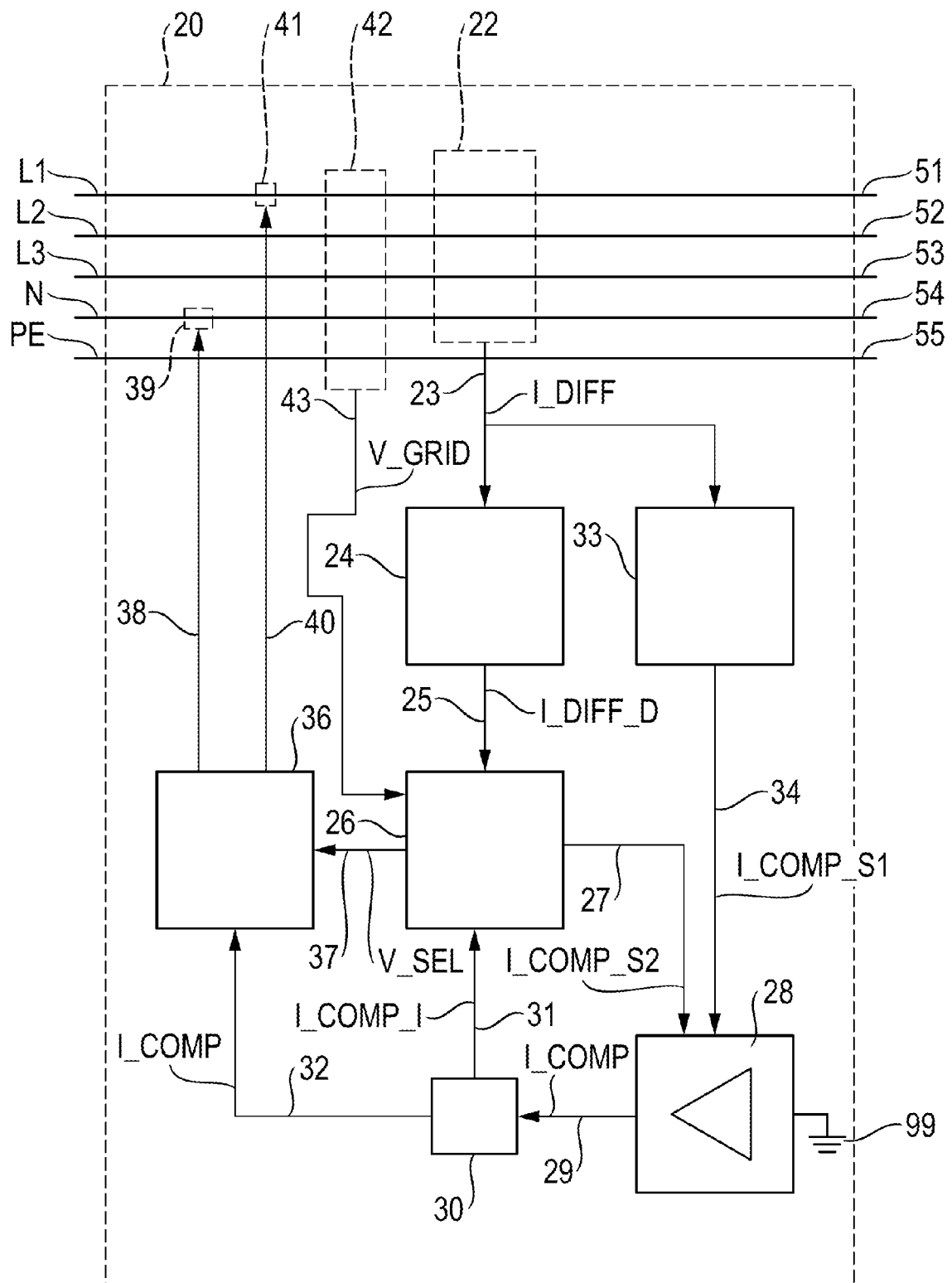

| | | | |
|---|---|---|---|
| 2014/0210411 A1* | 7/2014 | Fluxa | H02J 3/02 320/109 |
| 2019/0270382 A1 | 9/2019 | Pfizenmaier et al. | |
| 2020/0195037 A1* | 6/2020 | Woo | B60L 53/22 |

FOREIGN PATENT DOCUMENTS

| | | |
|---|---|---|
| DE | 102010013642 A1 | 10/2011 |
| EP | 2372857 A1 | 10/2011 |
| EP | 2724443 A2 | 4/2014 |

* cited by examiner

COMPENSATION DEVICE FOR LEAKAGE CURRENTS

CROSS-REFERENCE TO RELATED APPLICATION

This application claims priority to German Patent Application No. 10 2019 126 438.3, filed Oct. 1, 2019, the content of such application being incorporated by reference herein in its entirety.

FIELD OF THE INVENTION

The invention relates to a compensation device for compensating leakage currents, in particular for use in the charger of a vehicle.

BACKGROUND OF THE INVENTION

Leakage currents are electric currents that flow in an undesired current path under normal operating conditions, for example from one of the phase conductors (L1 to L3) to protective earth (PE). Such leakage currents in practice occur for example as a result of filter capacitors of a line filter that are connected to a DC voltage path on one side and to protective earth (PE) on the other side.

DE 195 25 417 C2, which is incorporated by reference herein, discloses a ground fault current compensation arrangement for a multiphase electricity supply grid having a passive reactance element.

DE 10 2010 013 642 A1, which is incorporated by reference herein, discloses a method for compensating leakage currents.

EP 2 724 443 B1, which is incorporated by reference herein, discloses a compensation system for a leakage current.

SUMMARY OF THE INVENTION

Described herein is a compensation device for compensating leakage currents and a vehicle having such a compensation device.

The compensation device for compensating leakage currents has a differential current measurement device, a first signal generation device, an amplifier and a feeder device. The differential current measurement device is able to be arranged on active conductors and is designed to record a first signal and to feed said first signal to the first signal generation device, which first signal is analog and characterizes the differential current at the active conductors. The first signal generation device is designed to generate a first compensation current specification signal suitable for the compensation from the first signal by way of analog signal processing and to feed this first compensation current specification signal to the amplifier in analog or digitized form. The amplifier is designed to generate a compensation current on the basis of the first compensation current specification signal, and the feeder device is designed to allow the compensation current to be fed in at at least one of the active conductors.

Using analog signal processing to generate the first compensation current specification signal takes at least partial precedence over digital signal processing. In particular at low and high frequencies, digital signal processing may be disadvantageous or require very complex and thus expensive digital circuits.

According to one preferred embodiment, the differential current measurement device is arranged on active conductors.

According to one preferred embodiment, the first signal generation device has a first analog filter that is designed as a frequency filter.

Using a frequency filter makes it possible to take into consideration relevant frequency ranges and not to take into consideration irrelevant frequency ranges or frequency ranges processed in another way.

According to one preferred embodiment, the first analog filter has a low-pass filter. Analog signal processing is well-suited to low frequencies.

According to one preferred embodiment, the first analog filter has a high-pass filter. Analog signal processing also makes it possible to evaluate high frequencies.

According to one preferred embodiment, the first analog filter has
a band-stop filter,
a band-pass filter, or
a band-stop filter and a band-pass filter.
This makes it possible to evaluate low and high frequencies and to mask medium frequencies.

According to one preferred embodiment, the first signal generation device has a second analog filter that is designed to perform a phase reversal of the first signal or of a signal derived from the first signal. By virtue of the phase reversal, the generated signal is able to be used directly to generate the compensation current. If however the amplifier already operates in an inverting manner, this step is not necessary.

According to one preferred embodiment, the compensation device has a control device, which control device is designed to allow digital signal processing. Additionally providing digital signal processing allows greater freedom than in the case of analog signal processing, and digital signal processing may also be used to respond to monitoring or for diagnostic purposes.

According to one preferred embodiment, the compensation device has a compensation current measurement device, which compensation current measurement device is designed to measure the compensation current, to generate a second signal characterizing this compensation current and to feed the second signal to the control device. The option of measuring the compensation current makes it possible to control the level of the compensation current or the function of the amplifier. Compensation currents are additionally able to be generated freely in a controlled manner for diagnostic purposes.

According to one preferred embodiment, the control device has a monitoring device, which monitoring device is designed to monitor the magnitude of the compensation current on the basis of the second signal. This increases the reliability of the compensation device.

According to one preferred embodiment, the control device is designed to generate a second compensation current specification signal on the basis of the second signal and to feed the second compensation current specification signal to the amplifier. The amplifier is thereby also able to be influenced by the control device.

According to one preferred embodiment, the compensation device has a signal processing device, which signal processing device has an analog-to-digital converter and is designed to convert the first signal into a third signal via the analog-to-digital converter and to feed the third signal to the control device, wherein the third signal is a digital signal. The control device is thereby able to digitally process the signal.

According to one preferred embodiment, the control device has a second signal generation device, which second signal generation device is designed to generate a second compensation current specification signal suitable for the compensation from the third signal and to feed this second compensation current specification signal to the amplifier. The compensation current is thus able to be influenced both by the first signal generation device and by the second signal generation device. This may also be referred to as a hybrid solution.

According to one preferred embodiment, the first signal generation device is designed to evaluate at least one first frequency sub-range of the first signal in order to determine the first compensation current specification signal, and in which the second signal generation device is designed, when determining the second compensation current specification signal, to evaluate at least one second frequency sub-range with respect to the entire frequency range of the first signal. At least one first frequency sub-range and at least one second sub-range from the entire frequency range of the first signal are thus evaluated in different signal generation devices. This makes it possible to use the respective signal generation device in a suitable frequency range.

According to one preferred embodiment, the at least one first frequency sub-range and the at least one second frequency sub-range do not overlap one another in each case. Since the individual frequency sub-ranges are different, there is no significant dual consideration of particular frequency sub-ranges.

According to one preferred embodiment, at least one frequency sub-range of the at least one first frequency sub-range comprises lower frequencies than each frequency sub-range of the at least one second frequency sub-range. Analog signal processing is performed at the lowest evaluated frequencies.

According to one preferred embodiment, at least one frequency sub-range of the at least one first frequency sub-range comprises higher frequencies than each frequency sub-range of the at least one second frequency sub-range. Analog signal processing is performed at the highest evaluated frequencies.

According to one preferred embodiment, precisely one second frequency sub-range is provided. Digital signal processing works well in a medium frequency range, and a further division is therefore not necessary and would unnecessarily complicate the device.

A vehicle has a charger for a consumer, which charger has a rectifier and a consumer connected directly or indirectly to the rectifier, wherein the consumer is coupled galvanically to the active conductors, and wherein the charger has a compensation device, wherein the consumer is preferably a traction battery. In the case of a vehicle having galvanic coupling, leakage currents arising within the vehicle are also able to be measured outside the vehicle and may lead to triggering of a fuse of the supply grid. Using the compensation device is therefore particularly advantageous in this case.

According to one preferred embodiment, the charger has an EMC filter or a line filter. Leakage currents may arise for example in such filters, and the compensation device may have an advantageous effect.

BRIEF DESCRIPTION OF THE DRAWING FIGURES

Figure 2:
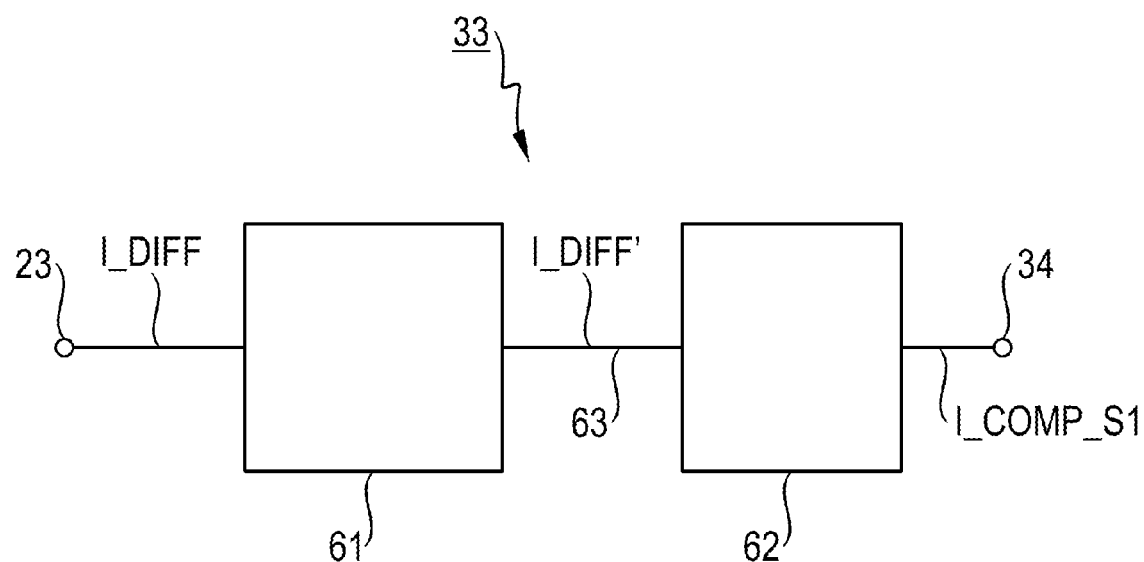
Figure 3:
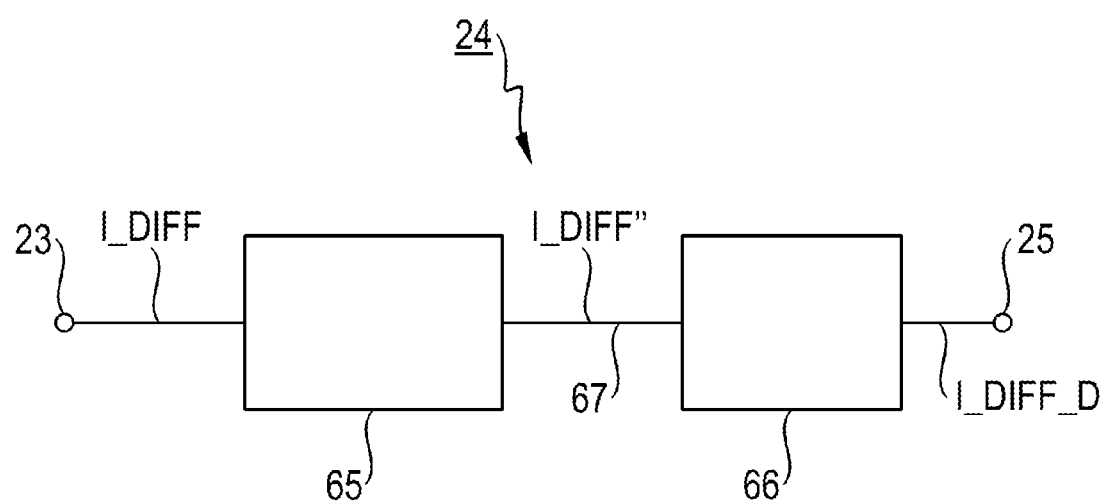
Figure 4:
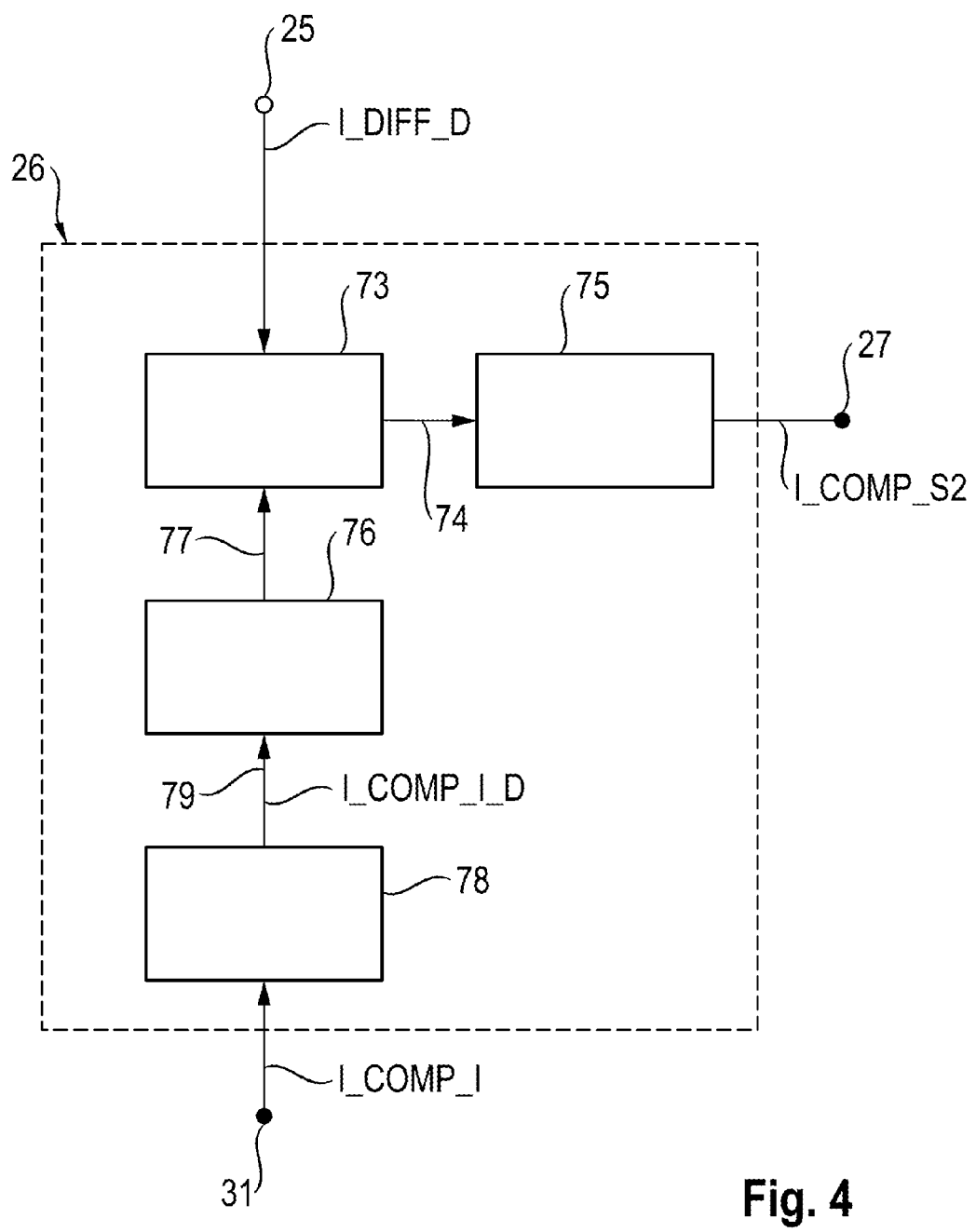
Figure 5:
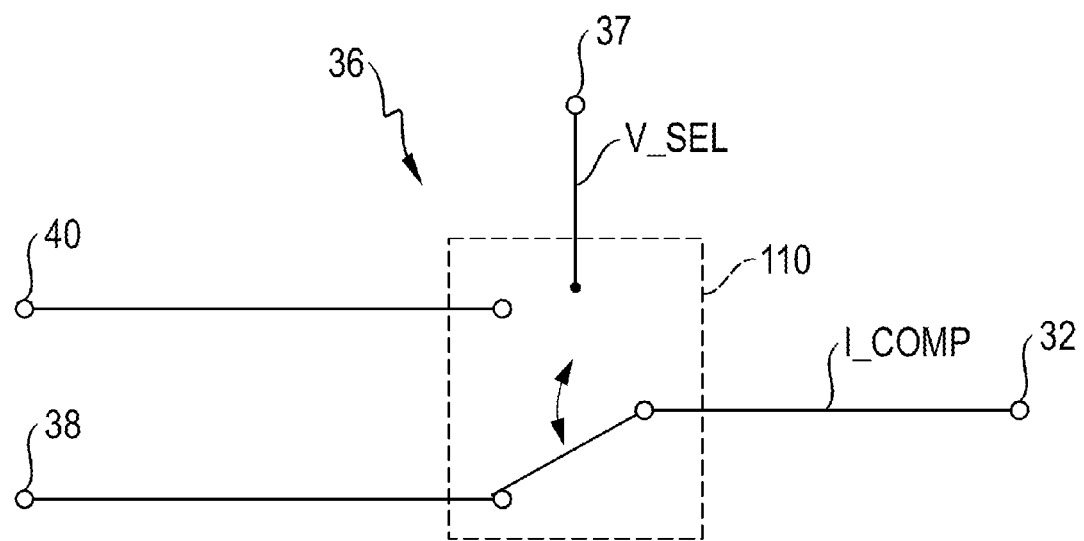
Figure 6:
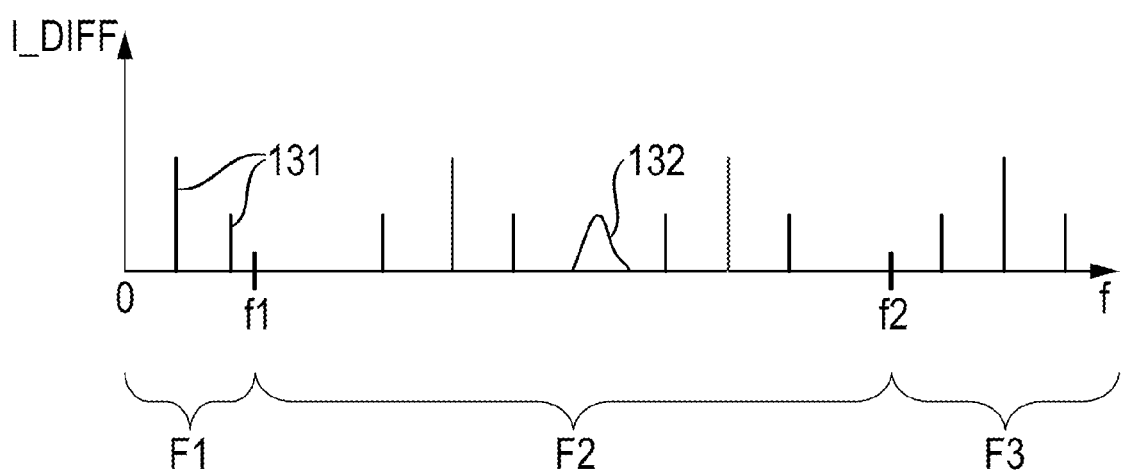
Figure 7:
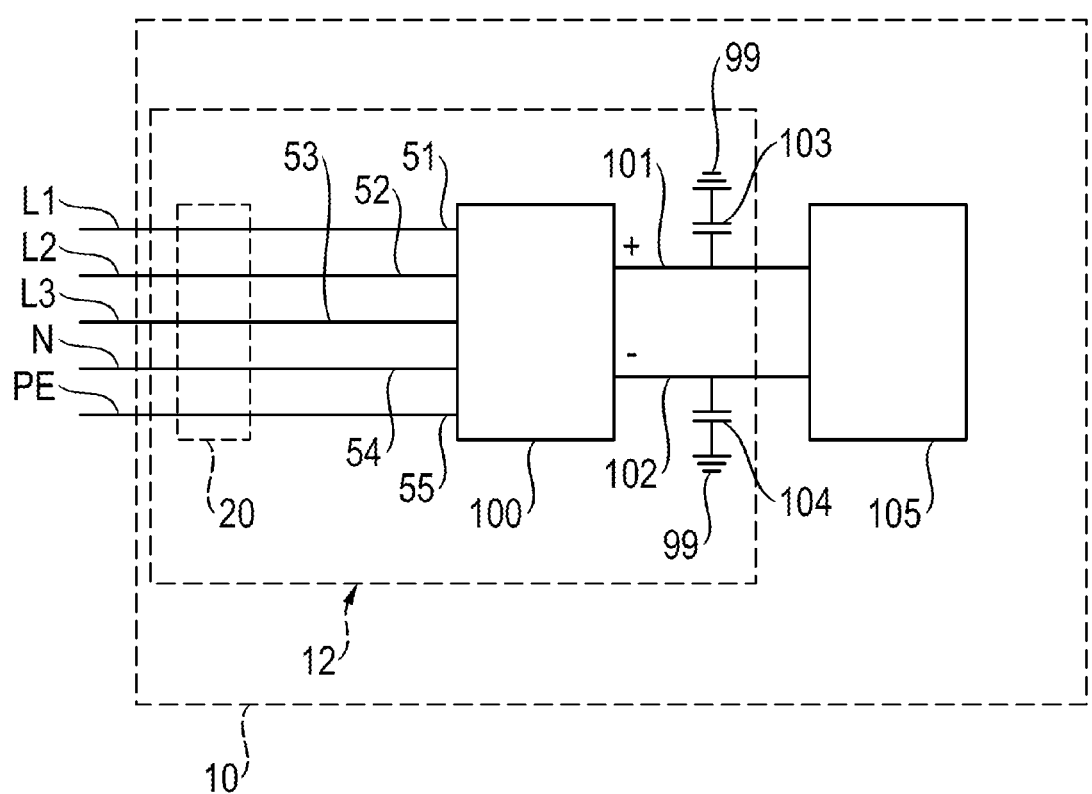

Further details and advantageous refinements of the invention will emerge from the exemplary embodiments described below and illustrated in the drawings, which embodiments should in no way be understood as restricting the invention, and also from the dependent claims. In the figures:

FIG. 1 shows an exemplary embodiment of a compensation device,

FIG. 2 shows an exemplary embodiment of a first signal generation device of FIG. 1, FIG. 3 shows an exemplary embodiment of a signal processing device of FIG. 1, FIG. 4 shows an exemplary embodiment of a control device of FIG. 1, FIG. 5 shows an exemplary embodiment of a compensation current selection device of FIG. 1, FIG. 6 shows a schematic frequency spectrum of a signal from a differential current measurement device of FIG. 1, and FIG. 7 shows the use of the compensation device of FIG. 1 in a vehicle.

DETAILED DESCRIPTION OF THE INVENTION

FIG. 1 shows an exemplary embodiment of a compensation device 20. Five conductors 51, 52, 53, 54 and 55 are provided. In the case of a three-phase current grid, the conductors 51 to 53 may be connected for example to the phase conductors (phases) L1, L2 and L3. The conductor 54 is connected to the neutral conductor N, and the conductor 55 is connected to protective earth PE. The conductors required for the current line, such as for example the conductors 51 to 53 for the phase conductors L1, L2, L3 of the supply grid and the conductor 54 for the neutral conductor N of the supply grid are referred to as active conductors. A differential current measurement device 22 measures the differential current of the active conductors 51 to 54. The differential current measurement device 22 may for example be designed as a summation current transformer in the form of a winding around the active conductors 51 to 54. If no fault currents or leakage currents occur, the sum of the currents through the conductors 51 to 54 and therefore also the current through the winding is zero. If on the other hand for example a leakage current flows through a Y capacitor of a line filter from the phase L1 to protective earth PE via a rectifier, the differential current measurement device 22 gives the resultant differential current. It is also possible for example to separately measure the summation current through the conductors 51 to 53, on the one hand, and through the conductor 54, on the other hand, and then to calculate the sum of or difference between the two values on the basis of the respective winding direction.

The signal I_DIFF from the differential current measurement device 22 is fed to a first signal generation device 33 via a line 23. The first signal generation device 33 is designed to generate a first compensation current specification signal I_COMP_S1 suitable for the compensation from the first signal I_DIFF by way of analog signal processing and to feed this first compensation current specification signal I_COMP_S1 to an amplifier 28 via a line 34. The first compensation current specification signal I_COMP_S1 is preferably fed to the amplifier 28 in analog form. If the amplifier 28 however requires a digital compensation current specification signal, the first compensation current specification signal I_COMP_S1 may be digitized beforehand by an analog-to-digital converter—not illustrated.

The signal I_DIFF is preferably additionally fed to a signal processing device 24 via a line 23. An analog-todigital conversion is performed for example in the signal processing device 24, and the resultant digital signal is referred to as I_DIFF_D. The signal processing device 24 transmits the signal I_DIFF_D to the control device 26 via a line 25. The control device 26, which is designed for example as a microcontroller or as a computing unit, calculates a value or a second compensation current specification signal I_COMP_S2 for a suitable compensation current from the determined differential current signal I_DIFF_D. This value I_COMP_S2 is fed to the amplifier 28 via a line 27.

The amplifier 28 generates a corresponding compensation current I_COMP on the basis of the first compensation current specification signal I_COMP_S1 and possibly additionally of the second compensation current specification signal I_COMP_S2. To this end, the amplifier 28 is connected to protective earth 99 in order to allow a current from or to protective earth 99. The amplifier 28 is connected to a compensation current measurement device 30 via a line 29. The compensation current measurement device 30 measures the compensation current and outputs a value or a signal I_COMP_I to the control device 26 via a line 31.

The amplifier 28 may be designed for example as a differential amplifier having an operational amplifier. As an alternative, a digital-to-analog converter or a class D amplifier are possible, for example.

The compensation current I_COMP reaches a compensation current selection device 36 via a line 32.

The compensation current selection device 36 is able to be actuated by the control device 26 via a line 37 via which a signal V_SEL is able to be transmitted. The compensation current selection device 36 may feed the compensation current to a first feeder device 39 via a line 38 and/or to a second feeder device 41 via a line 40.

A supply grid detection device 42 is provided in order to detect the supply grid connected to the conductors 51 to 55. To this end, the supply grid detection device 42 measures for example the voltages at the terminals 51 to 55 using a voltage measurement device. This may take place directly in the supply grid detection device 42 or else in the control device 26. In the case of a Central European three-phase current grid, the conductors 51 to 55 are connected to the terminals L1, L2, L3, N and PE illustrated on the left. In the case of a US split-phase grid, the terminal HOT1 is preferably connected to the conductor 51, the terminal HOT2 phase-shifted by 180° is connected to the conductor 54 and protective earth PE is connected to the conductor 55. In the case of a single-phase Central European grid, due to the ambiguous assignment between plug and socket, either the conductor 51 is connected to L1 and the conductor 54 is connected to N, or the conductor 51 is connected to N and the conductor 54 is connected to L1. The assignment is thus not necessarily unambiguous. The supply grid detection device 42 outputs a detection signal V_GRID to the control device 26 via a line 43.

The feeder devices 39 and 41 may perform the feeding in for example through a capacitive coupling or through an inductive coupling.

In the case of a supply grid having a neutral conductor N, feeding in is preferably performed into this, since the voltage at the neutral conductor N is normally low, and the supply voltage for the infeed may therefore be low in comparison with the voltages at the phases.

The signal I_COMP_S1 or I_COMP_S2 for the compensation current I_COMP is calculated for example by determining the frequency spectrum of the differential current or of the signal I_DIFF, wherein a frequency range from 20 Hz to 300 kHz may for example be sufficient. The frequency spectrum contains corresponding amplitudes, and the signal I_COMP_S is generated with a phase shift of 180° (phase opposition) in order to bring about corresponding compensation. Other calculations in which the integral is calculated are also possible.

FIG. 2 shows an exemplary embodiment of the first signal generation device 33. It has a first filter 61 and a second filter 62.

The analog signal I_DIFF is fed to the first filter 61 via the line 23.

The first filter 61 is designed as an analog frequency filter. It has a frequency-dependent transfer behavior.

The first filter 61 may have for example a low-pass filter, a high-pass filter, a band-stop filter and/or a band-pass filter.

A Butterworth filter, a Legendre filter or a Chebyshev filter may be used for example as band-pass filter. Two limit frequencies are defined in the case of band-pass filters and band-stop filters. In the case of the band-pass filter, the frequencies outside the frequency range defined by the limit frequencies are attenuated, and in the case of the band-stop filter, the frequencies within this frequency range are attenuated. The limit frequencies are usually defined as the frequencies at which the amplitude has dropped by 3 dB.

A first-order, second-order or higher-order filter may be used as low-pass filter or high-pass filter, for example.

The signal I_DIFF resulting from the first filter 61, which signal may be referred to as I_DIFF' due to the influence of the first filter 61, is fed to the second filter 62 via a line 63.

The second filter 62 is designed as an analog filter and intended to perform a phase reversal of the first signal I_DIFF or of the signal I_DIFF' derived from the first signal I_DIFF. The phase reversal may performed for example by an inverting amplifier.

The second filter 62 delivers the signal I_COMP_S1 via the line 34, as is described in FIG. 1.

The design of the first signal generation device 33 for performing analog signal processing in particular has advantages at low frequencies and at high frequencies. Digital signal processing normally requires an entire period of the respective frequency for calculation purposes. At low frequencies of a few hertz, this leads to a large delay and possibly even to triggering of a fault current circuit breaker. Digital signal processing requires a high sampling rate at high frequencies due to the Nyquist-Shannon sampling theorem, on the one hand, and the control device has to be designed to be correspondingly fast or with great computational power, on the other hand, which is linked to high costs.

The order of the filters 61, 62 may be swapped.

FIG. 3 shows an exemplary embodiment of the signal processing device 24, which has a frequency filter 65 and an analog-to-digital converter 66. The analog signal I_DIFF is fed to the frequency filter 65 via the line 23. The frequency filter 65 may be used to select the frequency range of the signal I_DIFF, which frequency range is processed by the control device 26 of FIG. 1. The resultant signal may furthermore be referred to as I_DIFF or, due to the change, as I_DIFF'', and it is fed to the analog-to-digital converter 66 via a line 67 and converted into a digital signal I_DIFF_D that is able to be fed to the control device 26 of FIG. 1 via the line 25.

The frequency filter 65 may also be referred to as a third filter, and it may be designed in the same way as one of the variants mentioned for the first filter 61 of FIG. 2.

The order of the frequency filter 65 and of the analog-to-digital converter 66 may be swapped, wherein in this case the frequency filter 65 has a digital design. The frequency filter 65 and the analog-to-digital converter 66 may also be integrated into the control device 26 of FIG. 1.

FIG. 4 shows an exemplary embodiment of the control device 26.

The signal I_DIFF_D is fed to a second signal generation device 73 via the line 25 of FIG. 1. The second signal generation device 73 is connected to a digital-to-analog converter 75 via a line 74, and the output of the digital-to-analog converter 75 is connected to the line 27 in order to feed the second compensation current specification signal I_COMP_S2 to the amplifier 28 of FIG. 1. The signal I_COMP_I is fed to the control device 26 via the line 31 and is digitized by an analog-to-digital converter 78. The resultant digitized signal I_COMP_I D is fed to a monitoring device 76 via a line 79. The monitoring device 76 is connected to the second signal generation device 73 via a line 77 and is able to influence said second signal generation device.

The control device may thus, on the one hand, calculate and output the second compensation current specification signal I_COMP_S2 on the basis of the signal I_DIFF or I_DIFF_D. On the other hand, the control device 26 may evaluate the signal I_COMP_I, which characterizes the magnitude of the compensation current I_COMP, and likewise influence the compensation current via the second signal generation device 73.

FIG. 5 shows an exemplary embodiment of the compensation current selection device 36 of FIG. 1. A switch 110 is provided, and the input thereof is connected to the line 32, via which the compensation current I_COMP is able to be fed. The switch 110 is able to be actuated by the signal V_SEL via the line 37, and the input of the switch 110 may be connected to the line 38 or to the line 40 on the basis of the signal V_SEL.

FIG. 6 schematically shows a frequency spectrum of the signal I_DIFF. Such a frequency spectrum may be generated for example through Fourier transformation of the signal I_DIFF. The frequency spectrum has amplitudes at particular frequencies 131, or broader frequency ranges 132 with amplitude profiles may also occur.

As described above, it is advantageous to perform analog signal processing in the first signal generation device 33 at very low frequencies (cf. FIG. 1 and FIG. 2), for example in the frequency range F1 that extends from the frequency f=0 Hz to f=f1. The frequency f1 may be for example 100 Hz or 500 Hz.

Analog signal processing also preferably takes place in the first signal generation device 33 (FIG. 1, FIG. 2) at high frequencies in a frequency range F3 that extends upward from a frequency f=f2. The frequency f2 may be for example 100 kHz or 200 kHz.

The frequency range F1 does not have to extend as far as the frequency f=0 Hz, and the frequency range F3 may be upwardly limited.

There is a frequency range F2 that extends from the frequency f1 to the frequency f2 between the frequency ranges F1 and F3. This frequency range F2 may be evaluated selectively by the first signal generation device 33 (FIG. 2) or by the second signal generation device 73 (FIG. 4).

Processing the frequency range F2 in the first signal generation device 33 has the advantage that the signal I_DIFF is able to be processed completely in the first signal generation device 33. Processing the frequency range F2 in the second signal generation device 73 has the advantage that digital signal processing offers easier optimization and further functions are easily able to be implemented.

As long as both compensation current specification signals I_COMP_S1 and I_COMP_S2 are present in analog and digital form, respectively, they may be linked through addition or—in the case of differing signs—subtraction. As an alternative, it is possible to weight the individual compensation current specification signals. As long as the amplifier 28 (FIG. 1) has both an analog input for the first compensation current specification signal I_COMP_S1 and a digital input for the second compensation current specification signal I_COMP_S2, these may also be processed in parallel. The first signal generation device 33 (FIG. 1, FIG. 2) is preferably designed to evaluate at least one first frequency sub-range F1, F3 of the first signal I_DIFF in order to determine the first compensation current specification signal I_COMP_S1, and the second signal generation device 73 (FIG. 4) is preferably designed, when determining the second compensation current specification signal I_COMP_S2, to evaluate at least one second frequency sub-range F2. The frequency sub-ranges in this case relate to sub-ranges of the entire frequency range of the first signal I_DIFF. The second frequency sub-range F2 may be divided further. It is thereby possible for example to exclude frequency sub-ranges where there is interference with the evaluation.

The at least one first frequency sub-range F1, F3 and the at least one second frequency sub-range F2 preferably do not overlap. The limit frequencies of one frequency sub-range are thus not within the limit frequencies of another frequency sub-range. Multiple consideration of frequency sub-ranges is thereby avoided. A slight overlap is however not critical.

In the exemplary embodiment, the frequency sub-range F1 is lower than the frequency sub-range F2, and the evaluation in the lower frequency sub-range F1 thus takes place using analog signal processing. The frequency sub-range F3 has higher frequencies than the frequency sub-range F2, and the processing of the high frequencies therefore likewise takes place using analog signal processing of the first signal generation device 33 (FIG. 1, FIG. 2).

FIG. 7 shows an exemplary embodiment of the use of the conductors 51 to 55 with the schematically illustrated compensation device 20 in a vehicle 10, in particular in an electric vehicle or a hybrid vehicle.

The conductors 51 to 53 (phase conductors), 54 (neutral conductor) and the conductor 55 (protective earth) are connected to a rectifier (AC-to-DC converter) 100, and provided at the output of the rectifier 100 are two conductors 101 (+) and 102 (−) at which a DC voltage is present. The arrangement may thus serve as a charger 12. The conductor 101 is connected to protective earth 99 via a capacitor 103, and the conductor 102 is connected to protective earth 99 via a capacitor 104. The conductors 101, 102 are connected directly or indirectly (for example via an additional DC-to-DC converter) to a consumer 105, for example a traction battery. The capacitors 103, 104 act as EMC filters or line filters and are also referred to as Y capacitors or filter capacitors. A current may flow through the capacitors 103, 104 to protective earth 99 (PE) during operation. Since the voltage at the conductors 101, 102 is generated via the current through the active conductors L1, L2, L3 and N, the leakage current to protective earth 99 leads to a differential current in the active conductors 51 to 54 that, when it exceeds a predefined limit value, may lead to tripping of a fuse or of a fault current circuit breaker of the supply terminal. Normal limit values of fuses in supply grids are for example 5 mA or 20 mA or 30 mA.

The leakage currents may be compensated by the compensation device 20 in the case of normal consumers to the extent that the fuse of the supply grid does not trip during normal operation on account of the limit value for leakage currents being exceeded.

This is advantageous in particular in the case of chargers 12 for electric vehicles or hybrid vehicles that have galvanic coupling between the DC current intermediate circuit 101, 102 and the conductors 51 to 54 or between the consumer 105 and the conductors 51 to 54. Unlike in the case of vehicles having galvanic isolation, as may be the case for example in the case of vehicles having transformers in the rectifier 100 or in a DC-to-DC converter, the leakage currents add together in the case of galvanic coupling and are visible on the supply grid. Using the compensation device 20 is therefore particularly advantageous in the case of vehicles having galvanic coupling.

Numerous variations and modifications are of course possible within the scope of the present invention.

If for example only a single-phase supply grid is present, the conductors 52 (L2) and 53 (L3) may be dispensed with.

What is claimed:

1. A compensation device for compensating leakage currents, said compensation device comprising:
   a differential current measurement device,
   a first signal generation device,
   an amplifier, and
   a feeder device,
   wherein the differential current measurement device is configured to be arranged on active conductors and is configured to record a first signal (I_DIFF) and to feed said first signal to the first signal generation device, which first signal (I_DIFF) is analog and characterizes a differential current at the active conductors,
   wherein the first signal generation device is configured to generate a first compensation current specification signal (I_COMP_S1) suitable for the compensation from the first signal (I_DIFF) by way of analog signal processing and to feed the first compensation current specification signal (I_COMP_S1) to the amplifier in analog or digitized form,
   wherein the amplifier is configured to generate a compensation current (I_COMP) on the basis of the first compensation current specification signal (I_COMP_S1), and
   wherein the feeder device is configured to allow the compensation current to be fed in at least one of the active conductors.

2. The compensation device as claimed in claim 1, in which the first signal generation device has a first analog filter that is configured as a frequency filter.

3. The compensation device as claimed in claim 2, in which the first analog filter has a low-pass filter.

4. The compensation device as claimed in claim 2, in which the first analog filter has a high-pass filter.

5. The compensation device as claimed in claim 2, in which the first analog filter has a band-stop filter, a band-pass filter, or a band-stop filter and a band-pass filter.

6. The compensation device as claimed in claim 1, in which the first signal generation device has a second analog filter that is configured to perform a phase reversal of the first signal (I_DIFF) or of a signal (I_DIFF') derived from the first signal (I_DIFF).

7. The compensation device as claimed in claim 1, further comprising a control device that is configured to allow digital signal processing.

8. The compensation device as claimed in claim 7, further comprising a compensation current measurement device that is configured to measure the compensation current (I_COMP), to generate a second signal (I_COMP_I) characterizing the compensation current (I_COMP) and to feed the second signal (I_COMP_I) to the control device.

9. The compensation device as claimed in claim 8, wherein the control device has a monitoring device that is configured to monitor a magnitude of the compensation current (I_COMP) on the basis of the second signal (I_COMP_I).

10. The compensation device as claimed in claim 8, wherein the control device is configured to generate a second compensation current specification signal (I_COMP_S2) on the basis of the second signal (I_COMP_I) and to feed the second compensation current specification signal (I_COMP_S2) to the amplifier.

11. The compensation device as claimed in claim 7, further comprising a signal processing device having an analog-to-digital converter and that is configured to convert the first signal (I_DIFF; I_DIFF") into a third signal (I_DIFF_D) via the analog-to-digital converter and to feed the third signal (I_DIFF_D) to the control device, wherein the third signal (I_DIFF_D) is a digital signal.

12. The compensation device as claimed in claim 11, in which the control device has a second signal generation device that is configured to generate a second compensation current specification signal (I_COMP_S2) suitable for the compensation from the third signal (I_DIFF_D) and to feed the second compensation current specification signal (I_COMP_S2) to the amplifier.

13. The compensation device as claimed in claim 12, in which the first signal generation device is configured to evaluate at least one first frequency sub-range (F1, F3) of the first signal (I_DIFF) in order to determine the first compensation current specification signal (I_COMP_S1), and in which the second signal generation device is configured, when determining the second compensation current specification signal (I_COMP_S2), to evaluate at least one second frequency sub-range (F2) with respect to an entire frequency range of the first signal (I_DIFF).

14. The compensation device as claimed in claim 13, in which the at least one first frequency sub-range (F1, F3) and the at least one second frequency sub-range (F2) do not overlap one another in each case.

15. The compensation device as claimed in claim 13, in which at least one frequency sub-range (F1) of the at least one first frequency sub-range (F1; F3) comprises lower frequencies than each frequency sub-range (F2) of the at least one second frequency sub-range (F2).

16. The compensation device as claimed in claim 13, in which at least one frequency sub-range (F3) of the at least one first frequency sub-range (F1; F3) comprises higher frequencies than each frequency sub-range (F2) of the at least one second frequency sub-range (F2).

17. The compensation device as claimed in claim 13, in which only one second frequency sub-range (F2) is provided.

18. A vehicle having a charger for a traction battery, which charger has a rectifier that is connected either directly or indirectly to the traction battery, wherein the traction battery is coupled galvanically to the active conductors, and wherein the charger has the compensation device as claimed in claim 1.

* * * * *